(12) United States Patent
Smyth

(10) Patent No.: US 12,389,704 B1
(45) Date of Patent: Aug. 12, 2025

(54) IMAGE SENSOR PACKAGE FOR CAMERA WITH SENSOR SHIFT ACTUATION

(71) Applicant: Apple Inc., Cupertino, CA (US)

(72) Inventor: Nicholas D. Smyth, San Jose, CA (US)

(73) Assignee: Apple Inc., Cupertino, CA (US)

( * ) Notice: Subject to any disclaimer, the term of this patent is extended or adjusted under 35 U.S.C. 154(b) by 85 days.

(21) Appl. No.: 17/576,647

(22) Filed: Jan. 14, 2022

Related U.S. Application Data

(60) Provisional application No. 63/138,303, filed on Jan. 15, 2021.

(51) Int. Cl.
  *H10F 39/00* (2025.01)
  *H04N 23/54* (2023.01)
  *H04N 23/68* (2023.01)

(52) U.S. Cl.
  CPC .......... *H10F 39/811* (2025.01); *H04N 23/54* (2023.01); *H04N 23/687* (2023.01); *H10F 39/018* (2025.01); *H10F 39/806* (2025.01); *H10F 39/809* (2025.01)

(58) Field of Classification Search
  CPC ......... H01L 27/14636; H01L 27/14625; H01L 27/14634; H01L 27/1469; H04N 23/54; H04N 23/687
  USPC ...................................... 348/208.7
  See application file for complete search history.

(56) References Cited

U.S. PATENT DOCUMENTS

| 5,862,014 A | 1/1999 | Nute |
| 7,679,647 B2 | 3/2010 | Stavely et al. |
| 9,664,562 B1 * | 5/2017 | Goodnough ........... H04N 23/23 |
| 11,223,765 B2 | 1/2022 | Smth et al. |
| 2009/0213236 A1 | 8/2009 | Chiou et al. |
| 2010/0238306 A1 * | 9/2010 | Ke .......................... H04N 23/68 348/208.7 |
| 2012/0224840 A1 * | 9/2012 | Minamisawa ........... G03B 5/00 359/554 |
| 2015/0321900 A1 | 11/2015 | Liu et al. |
| 2015/0350500 A1 | 12/2015 | Gutierrez et al. |
| 2017/0227731 A1 * | 8/2017 | Erömäki ................ H04N 23/54 |
| 2017/0227785 A1 | 8/2017 | Chan et al. |
| 2017/0273171 A1 * | 9/2017 | Codd .................... H04N 25/617 |
| 2018/0039162 A1 * | 2/2018 | Ali .......................... G02B 7/028 |
| 2018/0259787 A1 | 9/2018 | Kim et al. |
| 2018/0376041 A1 * | 12/2018 | Miura ..................... H04N 23/55 |
| 2019/0020822 A1 * | 1/2019 | Sharma .................... G03B 5/00 |

(Continued)

FOREIGN PATENT DOCUMENTS

| WO | 2017/156462 | 9/2017 |
| WO | 2019/018364 | 1/2019 |

OTHER PUBLICATIONS

U.S. Appl. No. 17/202,252, filed Mar. 13, 2021, Nicholas D. Smyth, et al.

*Primary Examiner* — Albert H Cutler

(74) *Attorney, Agent, or Firm* — Robert C. Kowert; Kowert, Hood, Munyon, Rankin & Goetzel, P.C.

(57) ABSTRACT

Various embodiments include an image sensor package for a camera with sensor shift actuation. The camera may include one or more actuators (e.g., a voice coil motor (VCM) actuator) for moving the image sensor package relative to a lens group of the camera. The image sensor package may include an image sensor and a substrate. The image sensor may be electrically connected to a ledge surface of a lower portion of the substrate, via one or more wire bond electrical interconnects.

19 Claims, 8 Drawing Sheets

(56) References Cited

U.S. PATENT DOCUMENTS

| | | |
|---|---|---|
| 2019/0141248 A1 | 5/2019 | Hubert et al. |
| 2019/0179107 A1* | 6/2019 | Hsu .................. H04N 23/54 |
| 2019/0235202 A1 | 8/2019 | Smyth et al. |
| 2020/0310227 A1* | 10/2020 | Hubert .................. G02B 7/025 |
| 2021/0092297 A1 | 3/2021 | Smyth et al. |
| 2021/0223563 A1* | 7/2021 | Miller .................. H04N 23/687 |
| 2022/0086317 A1* | 3/2022 | Paik .................. H04N 23/57 |
| 2022/0381617 A1* | 12/2022 | Wakabayashi ......... H04N 23/52 |
| 2023/0022940 A1* | 1/2023 | Taguchi .................. H01L 23/38 |
| 2023/0156911 A1* | 5/2023 | Tanaka .................. H04N 23/54 |
| | | 348/208.11 |

\* cited by examiner

IMAGE SENSOR PACKAGE FOR CAMERA WITH SENSOR SHIFT ACTUATION

This application claims benefit of priority to U.S. Provisional Application Ser. No. 63/138,303, entitled "Image Sensor Package for Camera with Sensor Shift Actuation," filed Jan. 15, 2021, and which is hereby incorporated herein by reference in its entirety.

BACKGROUND

Technical Field

This disclosure relates generally to architecture for an image sensor package for a camera with sensor shift actuation.

Description of the Related Art

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis of the camera to refocus the camera.

BRIEF DESCRIPTION OF THE DRAWINGS

FIG. 3A shows a flex circuit including a portion disposed below the image sensor. FIG. 3B shows a flex circuit including a cut-out that at least partially encircles the image sensor.

FIG. 4A shows an exploded perspective view of the example flexure arrangement and the image sensor package. In FIG. 4B, the exploded perspective view is collapsed to show the image sensor package mounted on the flexure arrangement.

Figure 1:
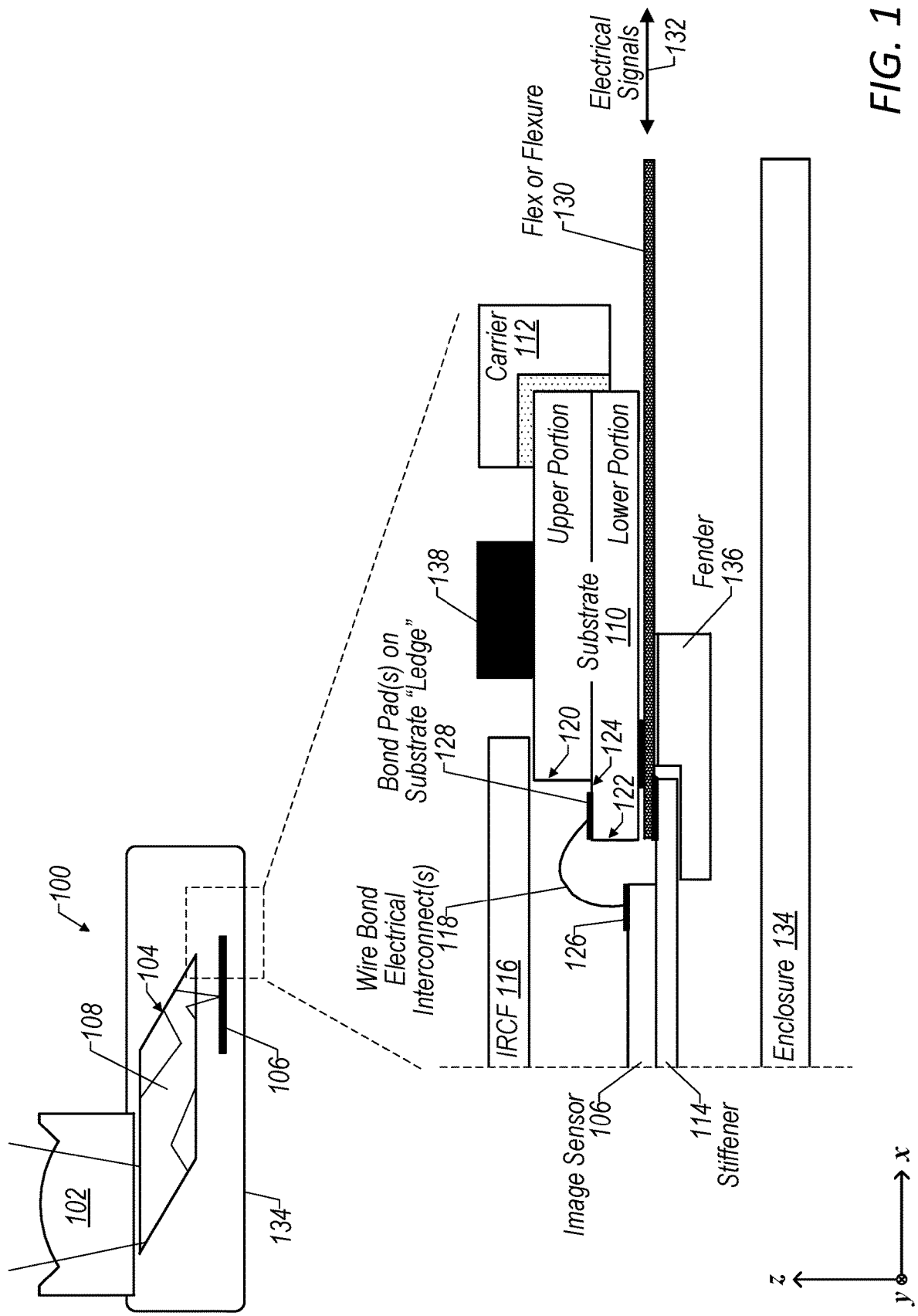
FIG. 1 illustrates a side cross-sectional view of an example camera having an image sensor package for sensor shift actuation, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112 (f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments include an image sensor package for a camera with sensor shift actuation. The camera may include one or more actuators (e.g., a voice coil motor (VCM) actuator) for moving the image sensor package relative to a lens group of the camera. The image sensor package may include an image sensor and a substrate. The image sensor may be electrically connected to a ledge surface of a lower portion of the substrate, via one or more wire bond electrical interconnects. In various embodiments, the wire bond arrangement disclosed herein may involve processes that reduce the risk of thermally demagnetizing the VCM actuator, relative to other camera designs that use flip chip arrangements that involve high-temperature flip chip processes.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

FIG. 1 illustrates a side cross-sectional view of an example camera 100 having an image sensor package for sensor shift actuation. The example X-Y-Z coordinate system shown in FIG. 1 may apply to embodiments discussed throughout this disclosure. According to various embodiments, the camera 100 may include one or more optical elements (e.g., lens group 102 and/or optical element(s) 104) and an image sensor package (e.g., comprising image sensor 106). The image sensor 106 may be configured to capture light 108 that has passed through the optical element(s), and generate image data based on the captured light 108. As discussed in further detail herein, the camera 100 may include one or more actuators (e.g., actuator(s) 602 in FIG. 6) for moving the image sensor 106 (and/or the image sensor package), e.g., relative to the lens group 102. Thus, the camera 100 may be configured with sensor shift actuation, which may be used to provide autofocus (AF) and/or optical image stabilization (OIS) functionality. In some embodiments, lens group 102 may include one or more lens elements that define an optical axis. In some embodiments, optical element(s) 104 may include one or more lens groups and/or one or more light path folding elements (e.g., a prism, a mirror, etc., configured to fold, or redirect, a path of light).

In some embodiments, the image sensor package may include the image sensor 106, a substrate 110, a carrier 112, a stiffener 114, and/or an optical element (e.g., an optical filter such as infrared cut-off filter (IRCF) filter 116). The substrate 110 may be electrically connected to the image sensor 106 via one or more wire bond electrical interconnects 118. As indicated in FIG. 1, the substrate 110 may include an upper portion and a lower portion. The upper portion may include a first inner surface 120 that extends in a first direction orthogonal to an image plane defined by the image sensor 106 (e.g., the Z-axis direction). The lower portion may include a second inner surface 122 that extends in the first direction orthogonal to the image plane. In various embodiments, the second inner surface 122 may be closer to the image sensor 106, relative to the first inner surface 120. Furthermore, the lower portion may include a ledge surface 124 that extends, in a second direction parallel to the image plane (and/or orthogonal to the first direction) (e.g., the X-axis direction and/or the Y-axis direction), from the first inner surface 120 to the second inner surface 122.

According to some embodiments, the wire bond interconnect(s) 118 may include a first end portion that is bonded to the image sensor 106 (e.g., via one or more bond pads 126 on a top surface of the image sensor 106), and a second end portion that is bonded to the ledge surface 124 (e.g., via bond pad(s) 128). In various embodiments, the image sensor package may include a plurality of wire bond interconnects 118, each of which may have a respective first end portion bonded to the image sensor 106 and a respective second end portion bonded to the ledge surface 124.

Figure 4A:
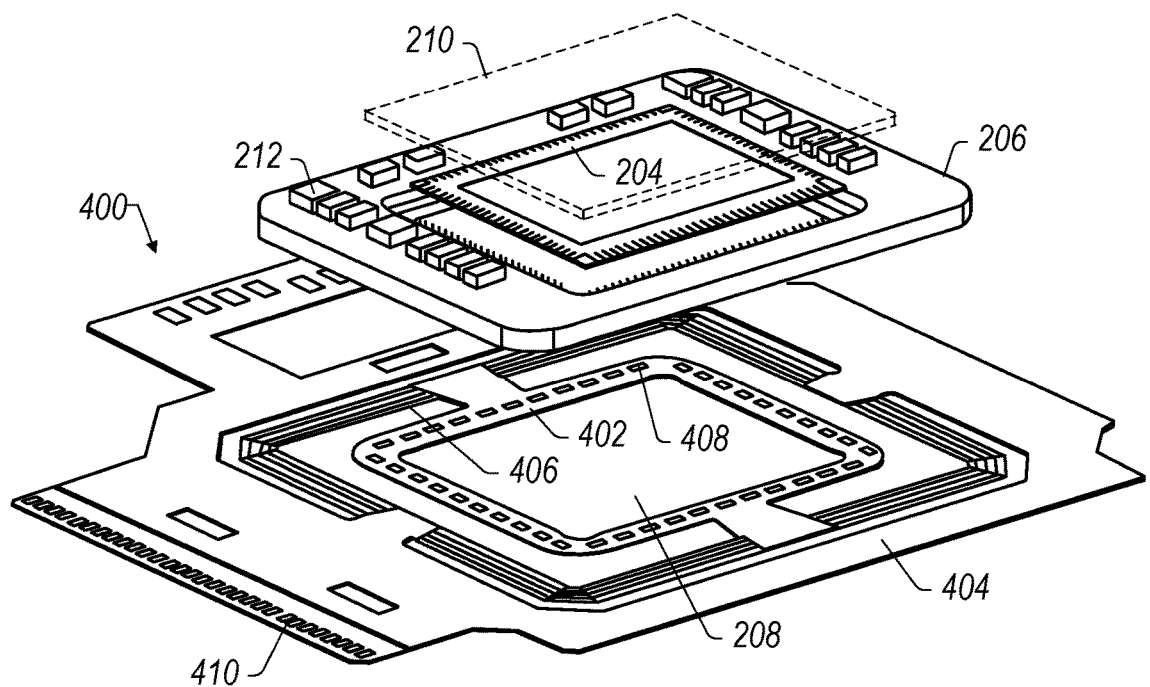
FIGS. 4A-4B illustrate views of an example flexure arrangement that may be coupled with an image sensor package for sensor shift actuation, in accordance with some embodiments.
Figure 4B:
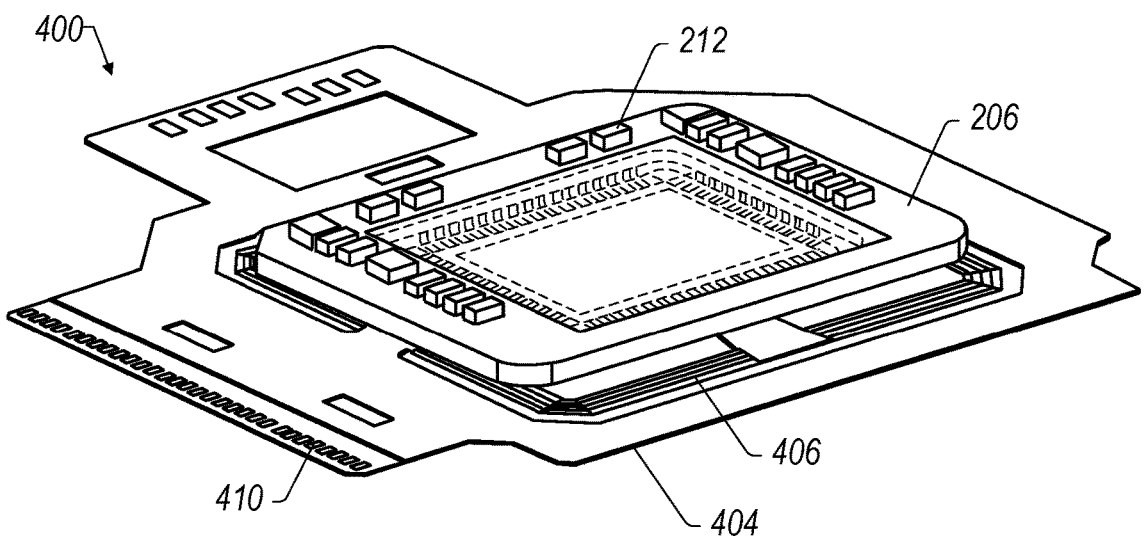

In some embodiments, the camera 100 may include a flex circuit 130 (and/or a flexure, such as the flexure arrangement 400 described herein with reference to FIGS. 4A-4B). The flex circuit 130 may be fixedly coupled with the substrate 110. In some embodiments, the stiffener 114 may be fixedly coupled with the image sensor 106 and the flex circuit 130, e.g., such that at least a portion of the flex circuit 130 is sandwiched between the stiffener 114 and the substrate 110. In various embodiments, the stiffener 114 may be attached to a bottom of the image sensor 106. The flex circuit 130 may be used to convey electrical signals 132, e.g., between the substrate 110 and one or more other components of the camera 100 (and/or of a device that includes the camera, such as device 700 in FIG. 7 and/or computer system 800 in FIG. 8). The electrical signals 132 may include power, control, and/or image signals, etc., in various embodiments. In some examples, image signals from the image sensor 106 may be conveyed to such other component(s) via the wire bond electrical interconnect(s) 118, the substrate 110, and/or the flex circuit 130. In some embodiments, a portion of the flex circuit 130 may extend beyond an outer periphery of the camera 100. In some examples, an enclosure 134 of the camera 100 may define at least a portion of the outer periphery of the camera 100. The enclosure 134 may encase at least a portion of the camera 100, e.g., as indicated in FIG.

1. According to some embodiments, the flex circuit 130 may convey electrical signals 132 to external component(s) that are external to the camera 100. Additionally, or alternatively, the flex circuit 130 may connected to another flex circuit (not shown), such that the flex circuit 130 is capable of conveying electrical signals 132 to the external component(s) via the other flex circuit. As discussed herein with reference to FIG. 2, the flex circuit 130 may be configured to allow motion of the image sensor package enabled by the actuator(s). As discussed herein with reference to FIGS. 2 and 3B, in some embodiments the flex circuit 130 may have a cut-out that enables positioning the image sensor 106 close to the substrate 110, which may enable a camera size reduction in one or more directions (e.g., in the X-axis direction and/or the Y-axis direction).

As previously mentioned, the image sensor package may include the carrier 112 in various embodiments. The carrier 112 may be fixedly coupled with the substrate 110. In various embodiments, at least a portion of the actuator(s) may be coupled with the carrier 112. As an example, the actuator(s) may comprise a voice coil motor (VCM) actuator. One or more magnets and/or one or more coils of the VCM actuator may be attached to the carrier 112, e.g., as discussed herein with reference to FIG. 6. Additionally, or alternatively, at least a portion of one or more suspension arrangements (e.g., suspension arrangement(s) 604 in FIG. 6) may be coupled with the carrier 112. For example, the suspension arrangement(s) may include one or more springs that are coupled to the carrier 112 and to one or more stationary structures, such that the suspension arrangement(s) suspend the image sensor package from the stationary structure(s) and allow motion of the image sensor package enabled by the actuator(s).

According to various embodiments, the actuator(s) may be configured to move the image sensor package in one or multiple directions. As an example, the actuator(s) may be configured to move the image sensor package in at least one direction parallel to the optical axis of lens group 102 (e.g., the Z-axis direction), e.g., to enable AF motion. Additionally, or alternatively, the actuator(s) may be configured to move the image sensor package in one or more directions orthogonal to the optical axis of lens group 102 (e.g., the X-axis direction and/or the Y-axis direction), e.g., to enable OIS motion.

In some embodiments, the IRCF 116 (and/or other optical element(s)) may be fixedly coupled with the substrate 110. For example, the IRCF 116 may be attached to a top side of the upper portion of the substrate 110, as indicated in FIG. 1. The image sensor 106 may be positioned, in the direction orthogonal to the image plane (e.g., the Z-axis direction), between the stiffener 114 and the IRCF 116. A bottom side of the image sensor 106 may be fixedly attached to the stiffener 114, and a top side (opposite the bottom side) of the image sensor 106 may face the IRCF 116, which may be positioned in the path of light 104, such that light passes through the IRCF 116 before reaching the image sensor 106. In some embodiments, the image sensor 106 may be entirely encapsulated within a chamber that is at least partially defined by the substrate 110, the stiffener 114, and/or the IRCF 116.

According to various embodiments, the flex circuit 130 and the substrate 110 may be separately formed and then attached to one another, e.g., using an adhesive. In some non-limiting examples, the substrate 110 may comprise a ceramic substrate. However, according to some embodiments, the substrate 110 may be integrally formed with the flex circuit 130, e.g., using an organic material, to produce what will be referred to herein as a "substrate-flex circuit hybrid structure" (or "hybrid structure" for brevity), where the term "hybrid" is used herein to characterize the multi-purpose use (flex circuit and substrate) of the structure. The hybrid structure may be a monolithic component that is formed of a single piece of material in some non-limiting embodiments. In some examples, use of the hybrid structure in the camera 100, instead of separately formed flex circuit and substrate components, may allow for a reduction of one or more steps in the manufacturing process for the camera 100.

In some embodiments, the camera 100 and/or the image sensor package may include a fender 136 fixedly coupled with the stiffener 114 and/or the flex circuit 130, e.g., as indicated in FIG. 1. The fender 136 may comprise a bottom surface that defines an end stop (e.g., with an inner surface of the enclosure 134) with respect to motion in the direction orthogonal to the image plane (the Z-axis direction).

In some embodiments, the camera 100 and/or the image sensor package may include one or more electrical component(s) 138 that are fixedly coupled with the substrate 110. For example, the electrical component(s) 138 may be mounted on the top surface of the substrate 110. According to some embodiments, the flex circuit 130 may be configured to convey electrical signals 132 between the electrical component(s) 138 and one or more other components. Electrical signals 132 may be routed between the electrical component(s) 138 and the flex circuit 130 via the substrate 110 in some embodiments.

Figure 2:
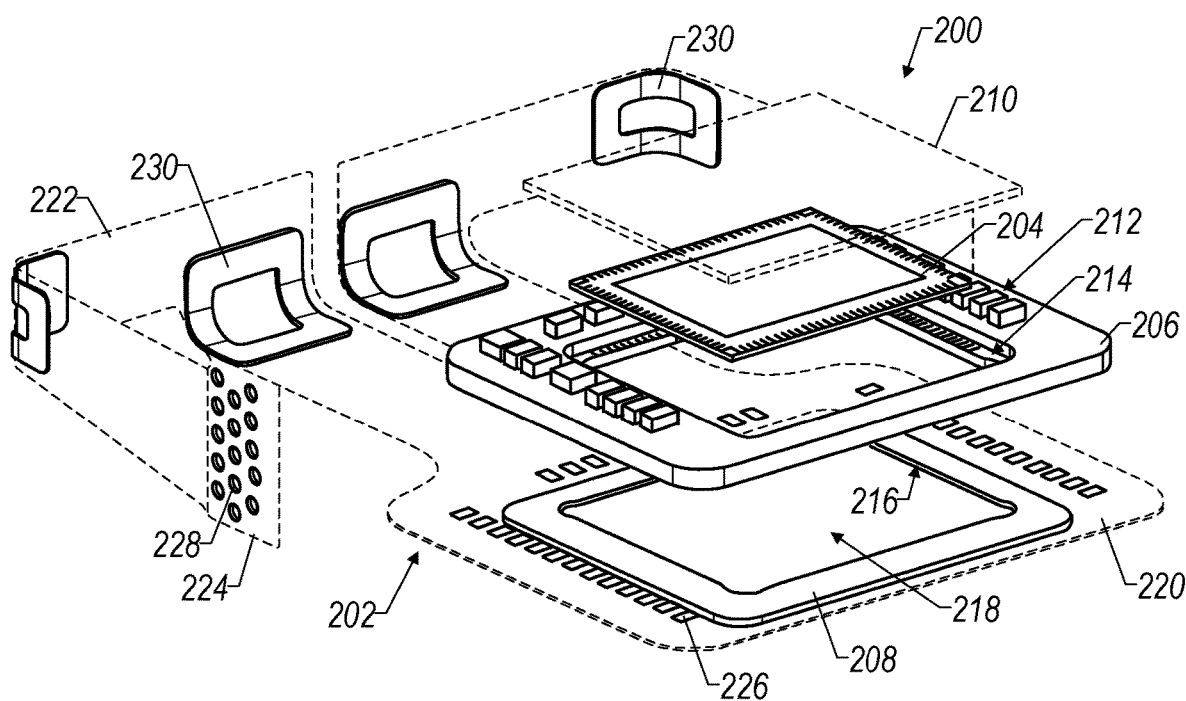
FIG. 2 illustrates an exploded perspective view of an example image sensor package and flex circuit for use in a camera with sensor shift actuation, in accordance with some embodiments.

FIG. 2 illustrates an exploded perspective view of an example image sensor package 200 and an example flex circuit 202 for use in a camera (e.g., camera 100 in FIG. 1) with sensor shift actuation. In various embodiments, the image sensor package 200 may include an image sensor 204, a substrate 206, a stiffener 208, one or more optical elements 210, and/or one or more electrical components 212. In some embodiments, the flex circuit 202 (or a portion of the flex circuit 202) may be considered to be part of the image sensor package 200. For example, the image sensor package 200 may include a portion of the flex circuit 202 that is fixedly coupled with the substrate 206 and/or the stiffener 208 in some embodiments. Unless otherwise specified herein, the description of the components in FIG. 2 may apply to same- or similarly-named components in FIG. 1, and vice-versa.

As indicated in FIG. 2, a lower portion of the substrate 206 may comprise a ledge surface 214 to which an end portion of wire bond electrical interconnect(s) (e.g., wire bond electrical interconnect(s) 118) may be bonded. Furthermore, another end portion of the wire bond electrical interconnect(s) may be bonded to the image sensor 204, e.g., to an upper surface of the image sensor 204. In various embodiments, an inner surface (e.g., inner surface 122 in FIG. 1) of the substrate 206 may at least partially encircle the image sensor 204. As indicated in FIG. 2, the substrate 206 may entirely encircle the image sensor 204 in some embodiments.

In some embodiments, the flex circuit 202 may comprise edges 216 that define a cut-out 218. According to some embodiments, the cut-out 218 may be positioned, in a direction orthogonal to an image plane of the image sensor 204, along a plane that intersects the image sensor 204. In some embodiments, the image sensor 204, the substrate 206, the stiffener 208, the optical element(s) 210, and/or the cut-out 218 may be concentrically aligned or otherwise be positioned along a same axis that is orthogonal to the image plane of the image sensor 204.

According to some embodiments, the flex circuit 202 may include a moveable end portion 220, an intermediate portion 222, and one or more fixed end portions 224. The moveable end portion 220 may be fixedly coupled with the substrate 206, such that the moveable end portion moves together (e.g., in lockstep) with the substrate 206 and the image sensor 204. The fixed end portion(s) 224 may be fixedly attached to a stationary structure of the camera. The intermediate portion 222 may extend between the moveable end portion 220 and the fixed end portion(s) 224, and may be configured to convey electrical signals between the moveable end portion 220 and the fixed end portion(s) 224. The intermediate portion 222 may be flexible and contain at least one bend region that interconnects at least two straight regions, so as to allow motion of the image sensor package 200 in one or more degrees of freedom. For example, the arrangement of the flex circuit 202 depicted in FIG. 2 may be configured to allow motion of the image sensor package 200 in the X-, Y-, and Z-axis directions.

In some embodiments, the moveable end portion 220 of the flex circuit 202 may comprise electrical connections 226 that may be connected to corresponding electrical connections (not shown) of the substrate 206, so that electrical signals (e.g., electrical signals 132 in FIG. 1) may be conveyed between the substrate 206 and the flex circuit 202. In some embodiments, the fixed end portion(s) 224 may comprise electrical connections 228 that may be connected to corresponding electrical connections (not shown) of the stationary structure and/or of another flex circuit.

In some embodiments, one or more of the bend region(s) of the intermediate portion 222 may be reinforced with a reinforcement material 230, such that portions of the bend region(s) are multi-layered to mitigate cyclic wear of the intermediate portion 222 at such bend region(s).

Figure 3A:
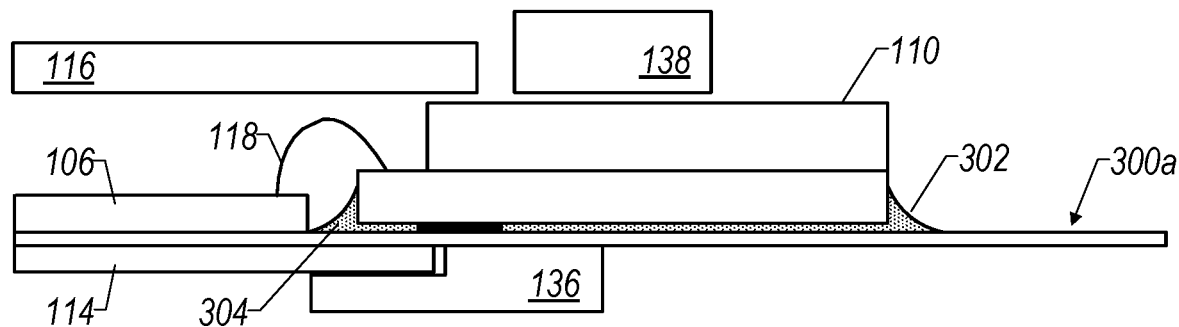
FIGS. 3A-3B illustrate side cross-sectional views of example flex circuits that may be coupled with an image sensor package for sensor shift actuation, in accordance with some embodiments.
Figure 3B:
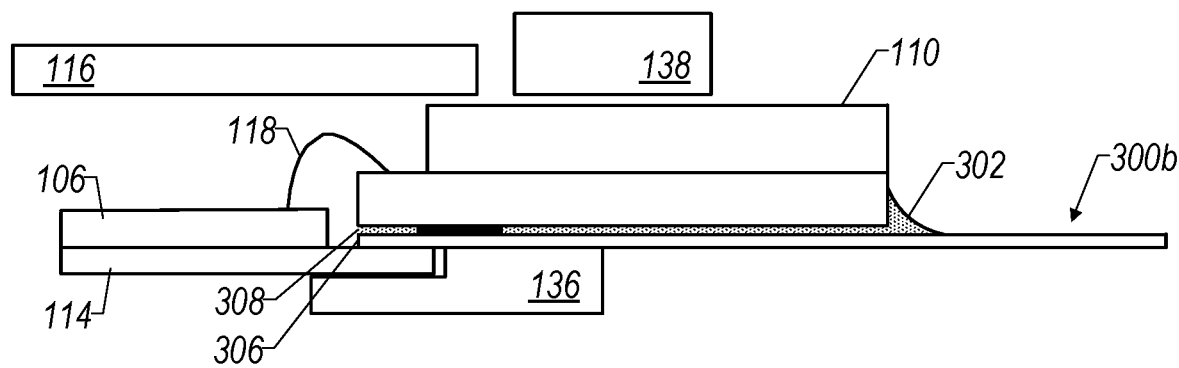

FIGS. 3A-3B illustrate side cross-sectional views of example flex circuits 300a and 300b that may be coupled with an image sensor package for sensor shift actuation in a camera (e.g., camera 100 in FIG. 1). FIG. 3A shows a flex circuit 300a including a portion disposed below the image sensor 106. FIG. 3B shows a flex circuit 300b including a cut-out (e.g., cut-out 218 in FIG. 2) that at least partially encircles the image sensor 106.

In some embodiments, an adhesive (e.g., glue) may be injected at one or more locations to underfill the substrate 110. In FIG. 3A, which shows the flex circuit 300a that does not include a cut-out, but rather includes a portion disposed below the image sensor 106, the underfill results in a significant outer adhesive fillet 302 and a significant inner adhesive fillet 304. The inner adhesive fillet 304 consumes space (e.g., in the X-axis direction and/or the Y-axis direction) that limits how close the image sensor 106 may be positioned relative to the substrate 110 and/or that may interfere with achieving a desired flatness of the image sensor 106 when attaching the image sensor 106.

The flex circuit 300b in FIG. 3B comprises one or more inner edges 306 that define the cut-out previously described. In some embodiments, the inner edge(s) 306 of the flex circuit 300b may be flush with an inner surface of the lower portion of the substrate 110. In some embodiments, the inner edge(s) 306 of the flex circuit 300b may be set back from the inner surface of the lower portion of the substrate 110. In various embodiments, an inner surface of an inner edge 306 does not extend, towards the image sensor 106, beyond the inner surface of the lower portion of the substrate 110. In this arrangement, the inner edge(s) 306 provide a capillary stop that prevents flow of the adhesive beyond the inner edge(s) 306, thus avoiding the formation of the inner adhesive fillet 302 of FIG. 3A, and allowing for a reduction in a lateral gap between the image sensor 106 and the substrate 110.

FIGS. 4A-4B illustrate views of an example flexure arrangement 400 that may be coupled with an image sensor package for sensor shift actuation in a camera (e.g., camera 100 in FIG. 1). FIG. 4A shows an exploded perspective view of the example flexure arrangement 400 and the image sensor package. In FIG. 4B, the exploded perspective view is collapsed to show the image sensor package mounted on the flexure arrangement 400.

In some embodiments, the flexure arrangement 400 may include an inner frame 402, an outer frame 404, and one or more flexure arms 406 that are connected to the inner frame 402 and to the outer frame 404. The inner frame 402 may be fixedly coupled with the substrate 206. For example, an upper surface of the inner frame 402 may be connected to the lower portion of the substrate 206. Furthermore, the stiffener 208 may be fixedly coupled with the image sensor 204 and the inner frame 402. In some embodiments, one or more electrical connections 408 on the inner frame 402 may be used to provide electrical interface(s) with the substrate 206 (e.g., via corresponding electrical connection(s) of the substrate 206). The outer frame 404 may be fixedly coupled with a stationary structure of the camera. The inner frame 402 may be moveable in one or more directions relative to the outer frame 404. The flexure arm(s) 406 may be configured to allow motion of the inner frame 402 and the image sensor package enabled by the actuator(s). In some embodiments, the inner frame 402 may be considered part of the image sensor package. Electrical traces on at least a portion of the flexure arm(s) 406 may be configured to convey electrical signals (e.g., electrical signals 132 in FIG. 1) between the inner frame 402 and the outer frame 404. In some embodiments, the outer frame 404 may have electrical connections 410 that enable the flexure arrangement 400 to electrically interface with one or more other components.

Figure 5:
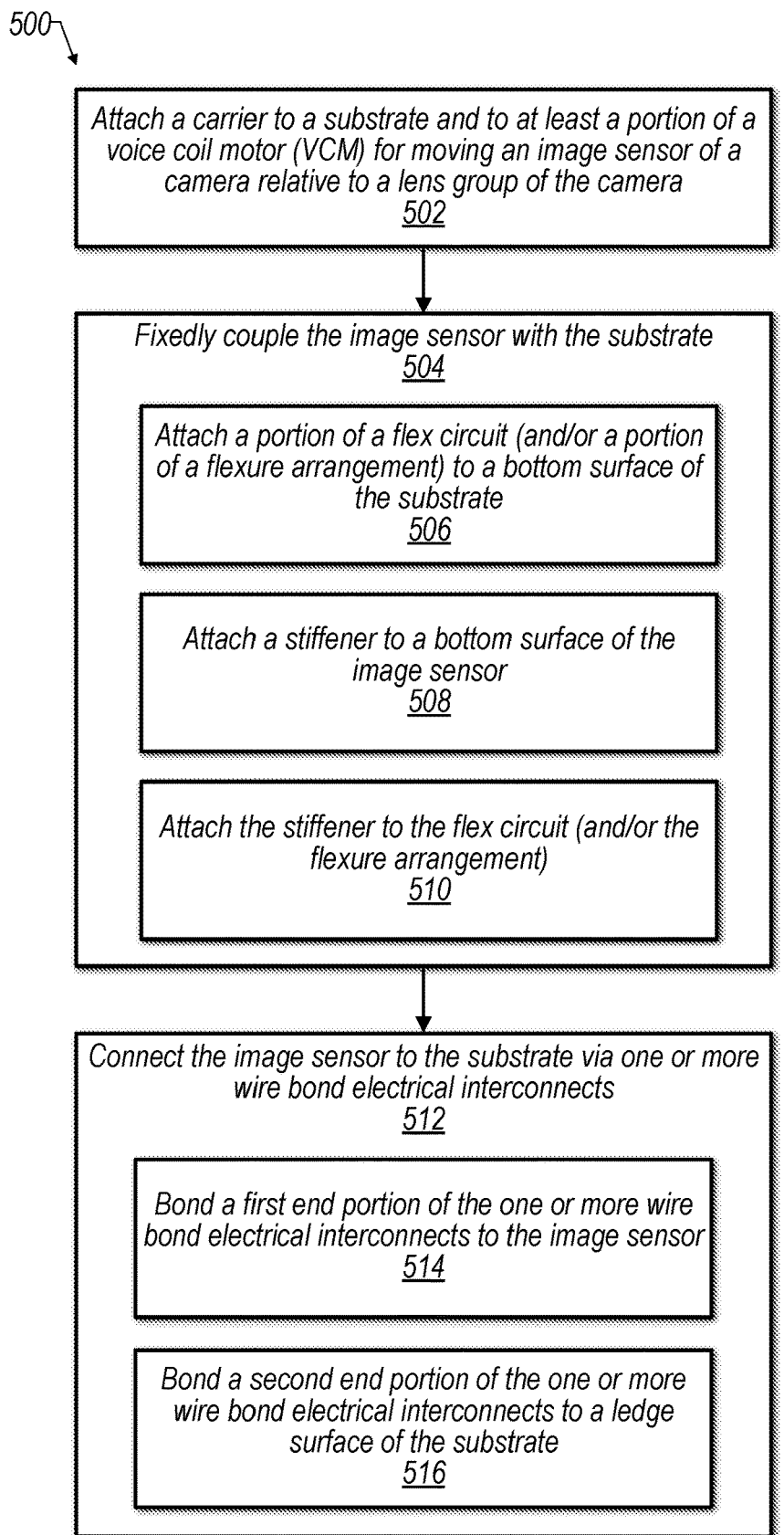
FIG. 5 is a flowchart of an example method of assembling a camera having an image sensor package for sensor shift actuation, in accordance with some embodiments.

FIG. 5 is a flowchart of an example method 500 of assembling a camera (e.g., camera 100 in FIG. 1) having an image sensor package for sensor shift actuation. It should be appreciated that the method 500 may include more or fewer operations than those represented by the blocks 502-516 in FIG. 5. Moreover, it should be appreciated that the order in which the operations represented by the depicted blocks may be different than the order indicated in the flowchart in FIG. 5.

At 502, the method 500 may include attaching a carrier to a substrate and to at least a portion of a voice coil motor (VCM) for moving an image sensor of a camera relative, e.g., relative to a lens group of the camera.

At 504, the method 500 may include fixedly coupling the image sensor with the substrate. In some examples, coupling the image sensor with the substrate may include attaching a portion of a flex circuit (and/or a portion of a flexure arrangement) to a bottom surface of the substrate, at 506. According to some embodiments, the flex circuit may comprise edges that define a cut-out that is sized to at least partially encircle the image sensor along a plane that intersects the image sensor. At least one of the edges, that define the cut-out, may be positioned such that an inner surface of the edge does not extend, towards the image sensor, beyond the inner surface of the substrate. Additionally, or alternatively, coupling the image sensor with the substrate may include attaching a stiffener to a bottom surface of the image sensor, at 508. In some embodiments, coupling the image sensor with the substrate may include attaching the stiffener to the flex circuit (and/or the flexure arrangement), at 510.

At 512, the method 500 may include connecting the image sensor to the substrate via one or more wire bond electrical interconnects. In some examples, connecting the image sensor to the substrate may include bonding a first end portion of the wire bond electrical interconnect(s) to the image sensor. Furthermore, connecting the image sensor to the substrate may include bonding a second end portion of the wire bond electrical interconnect(s) to a ledge surface of the substrate. According to some implementations, connecting the image sensor to the substrate via the wire bond electrical interconnects (at 512) may occur during a time period after attaching the carrier to the substrate and to at least a portion of the VCM actuator (at 502). For instance, the image sensor may be connected to the substrate via the wire bond electrical interconnects after a VCM module that includes the carrier and the substrate has been assembled.

Figure 6:
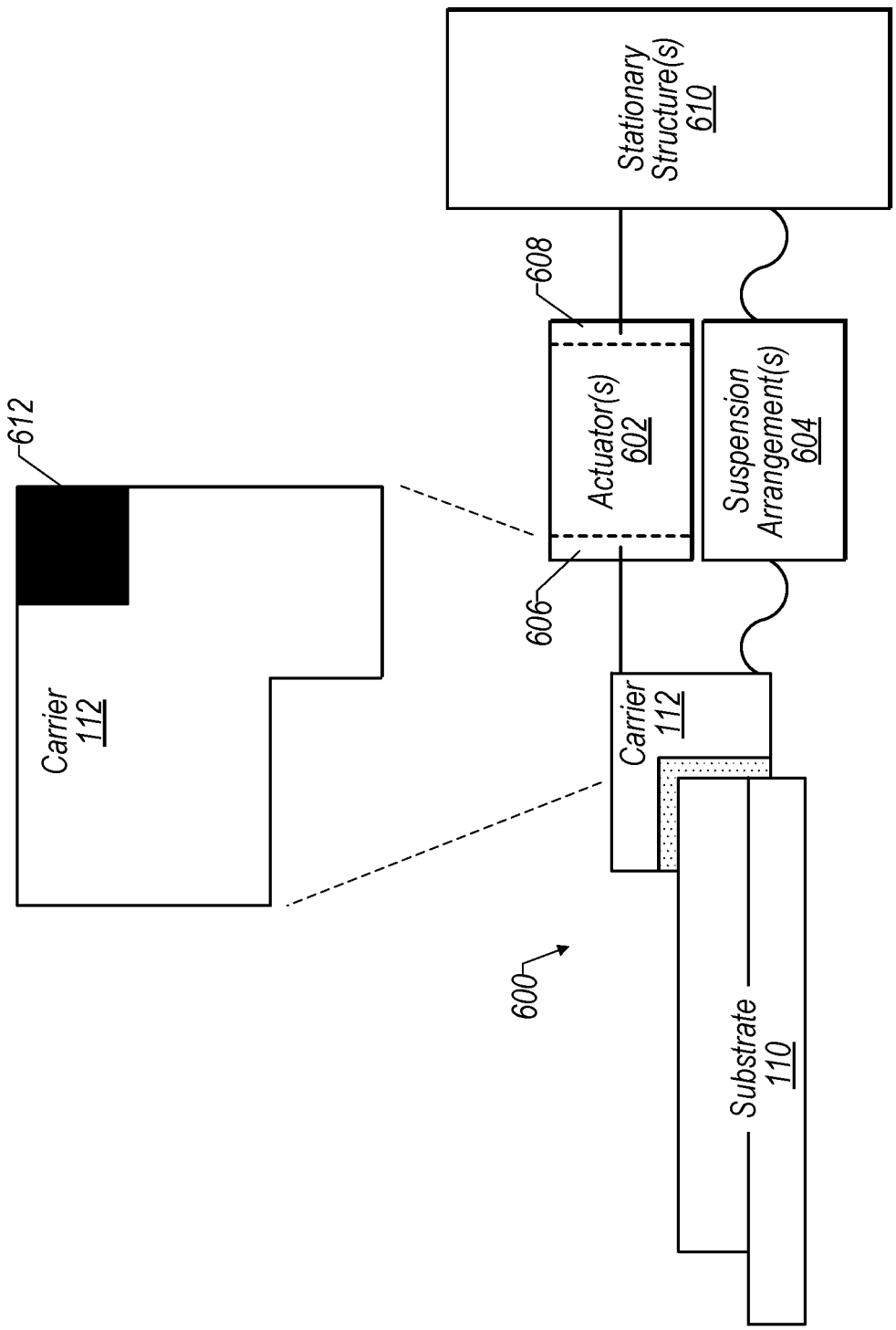
FIG. 6 illustrates a schematic block diagram of a portion of an image sensor package that may be coupled with one or more actuators and/or one or more suspension arrangements, e.g., to enable sensor shift actuation, in accordance with some embodiments.

FIG. 6 illustrates a schematic block diagram of a portion of an image sensor package 600 that may be coupled with one or more actuators 602 and/or one or more suspension arrangements 604, e.g., to enable sensor shift actuation in a camera (e.g., camera 100 in FIG. 1). In various embodiments, the actuator(s) 602 may comprise a voice coil motor (VCM) actuator that includes one or more magnets and one or more coils. In some embodiments, a magnet may be positioned proximate a coil, such that the coil is capable of electromagnetically interacting with the magnet when a drive current is supplied to the coil. Such electromagnetic interaction may produce Lorentz forces move the image sensor package.

As indicated in FIG. 6, in various embodiments a first portion 606 of the actuator(s) 602 may be fixedly coupled with the carrier 112, and a second portion 608 of the actuator(s) 602 may be fixedly coupled with one or more stationary structures 610 of the camera. For example, each of the first portion 606 and the second portion 608 of the actuator(s) 602 may include magnet(s) and/or coil(s). FIG. 6 shows an example of the first portion 606 comprising a magnet 612 that is attached to the carrier 112. As previously mentioned, some other camera designs that use a flip chip image sensor arrangement may require processes involving high temperatures that may cause the VCM actuator (e.g., at least partially due to the proximity of the magnet 612 to the image sensor connection site) to thermally demagnetize, thus potentially compromising the performance of the VCM actuator. By contrast, the wire bond arrangement disclosed herein may involve significantly lower temperatures, relative to flip chip processes, and thus the risk of thermally demagnetizing the VCM actuator may be reduced.

In some embodiments, the suspension arrangement(s) 604 may include one or more springs, one or more suspension wires, and/or one or more flexures, etc. A portion of the suspension arrangement 604 may be attached to the carrier 112 in some embodiments. Another portion of the suspension 604 arrangement may be attached to the stationary structure(s) 610 in some embodiments. The suspension arrangement 604 may be configured to suspend the image sensor package 600 from the stationary structures(s) 610. Furthermore, the suspension arrangement 604 may be configured to allow motion of the image sensor package 600 enabled by the actuator(s) 602.

Figure 7:
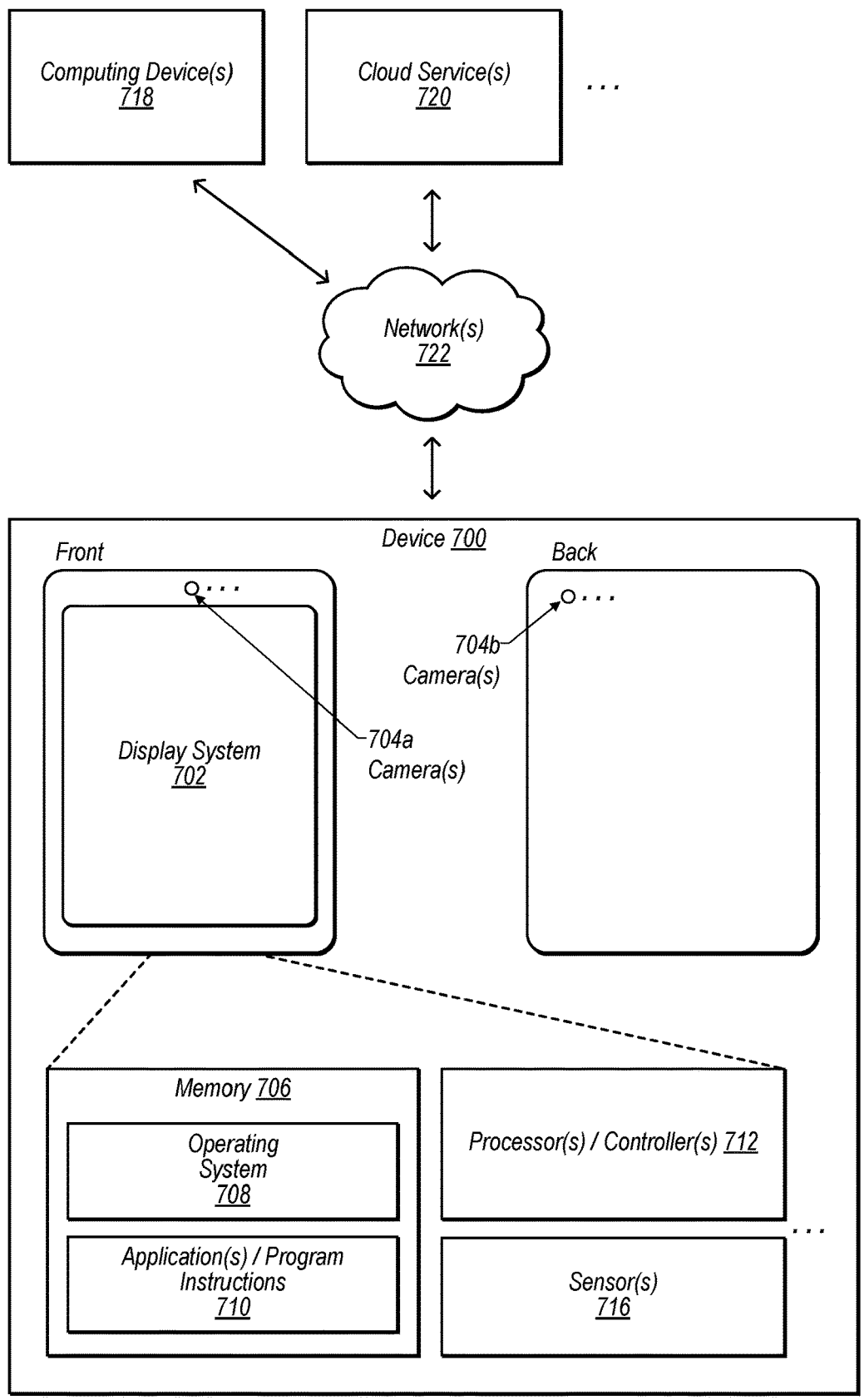
FIG. 7 illustrates a schematic representation of an example device that may include a camera having an image sensor package for sensor shift actuation, in accordance with some embodiments.

FIG. 7 illustrates a schematic representation of an example device 700 that may include a camera (e.g., camera 100 in FIG. 1) having an image sensor package for sensor shift actuation, in accordance with some embodiments. In some embodiments, the device 700 may be a mobile device and/or a multifunction device. In various embodiments, the device 700 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 700 may include a display system 702 (e.g., comprising a display and/or a touch-sensitive surface) and/or one or more cameras 704. In some non-limiting embodiments, the display system 702 and/or one or more front-facing cameras 704a may be provided at a front side of the device 700, e.g., as indicated in FIG. 7. Additionally, or alternatively, one or more rear-facing cameras 704b may be provided at a rear side of the device 700. In some embodiments comprising multiple cameras 704, some or all of the cameras may be the same as, or similar to, each other. Additionally, or alternatively, some or all of the cameras may be different from each other. In various embodiments, the location(s) and/or arrangement(s) of the camera(s) 704 may be different than those indicated in FIG. 7.

Among other things, the device 700 may include memory 706 (e.g., comprising an operating system 708 and/or application(s)/program instructions 710), one or more processors and/or controllers 712 (e.g., comprising CPU(s), memory controller(s), display controller(s), and/or camera controller(s), etc.), and/or one or more sensors 716 (e.g., orientation sensor(s), proximity sensor(s), and/or position sensor(s), etc.). In some embodiments, the device 700 may communicate with one or more other devices and/or services, such as computing device(s) 718, cloud service(s) 720, etc., via one or more networks 722. For example, the device 700 may include a network interface (e.g., network interface 710) that enables the device 700 to transmit data to, and receive data from, the network(s) 722. Additionally, or alternatively, the device 700 may be capable of communicating with other devices via wireless communication using any of a variety of communications standards, protocols, and/or technologies.

Figure 8:
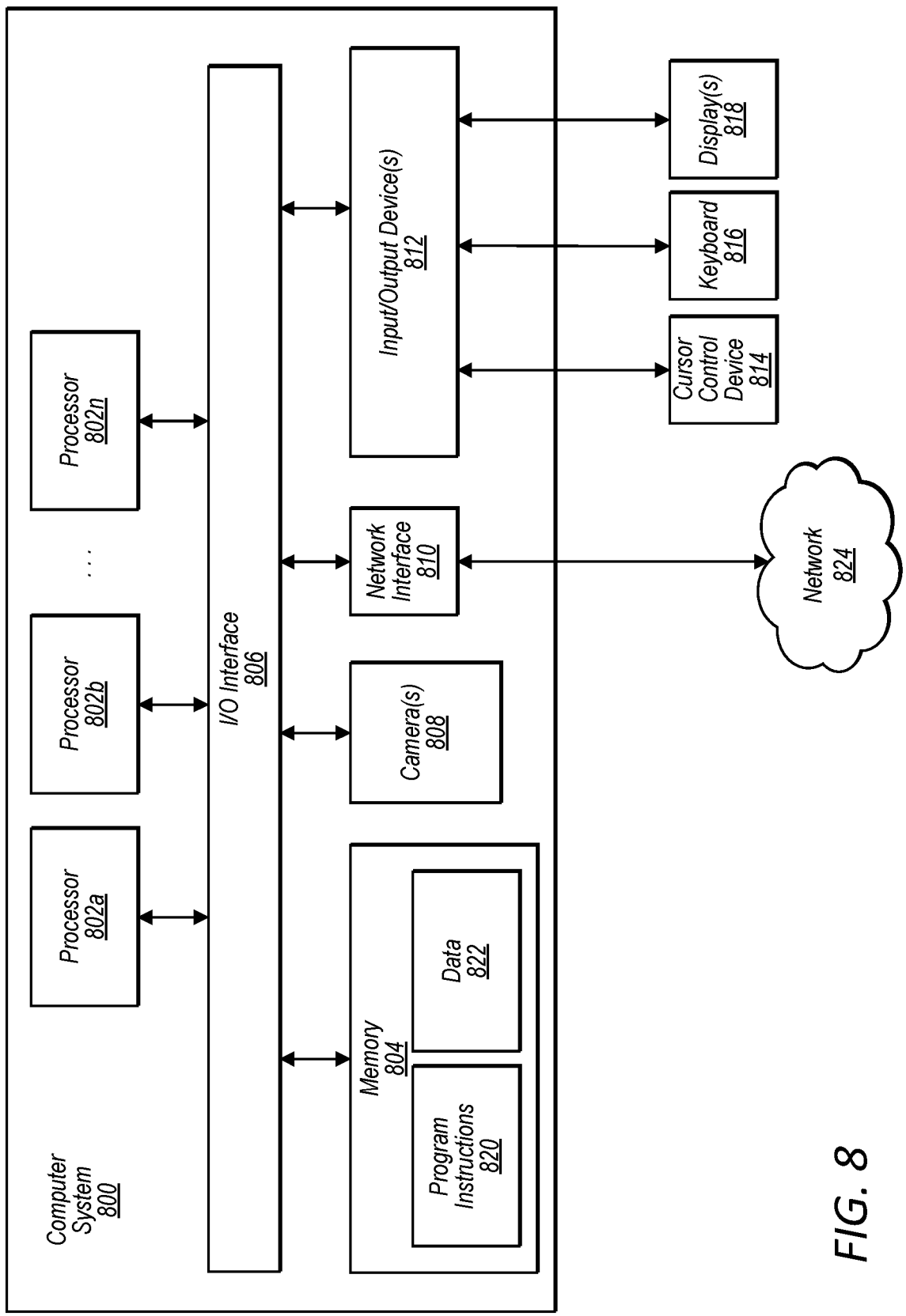
FIG. 8 illustrates a schematic block diagram of an example computer system that may include a camera having an image sensor package for sensor shift actuation, in accordance with some embodiments.

FIG. 8 illustrates a schematic block diagram of an example computing device, referred to as computer system 800, that may include or host embodiments of a camera (e.g., camera 100 in FIG. 1) having an image sensor package for sensor shift actuation, e.g., as described herein with reference to FIGS. 1-7. In addition, computer system 800 may implement methods for controlling operations of the camera and/or for performing image processing images captured with the camera. In some embodiments, the device 700 (described herein with reference to FIG. 7) may additionally, or alternatively, include some or all of the functional components of the computer system 800 described herein.

The computer system 800 may be configured to execute any or all of the embodiments described above. In different embodiments, computer system 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 800 includes one or more processors 802 coupled to a system memory 804 via an input/output (I/O) interface 806. Computer system 800 further includes one or more cameras 808 coupled to the I/O interface 806. Computer system 800 further includes a network interface 810 coupled to I/O interface 806, and one or more input/output devices 812, such as cursor control device 814, keyboard 816, and display(s) 818. In some cases, it is contemplated that embodiments may be implemented using a single instance of computer system 800, while in other embodiments multiple such systems, or multiple nodes making up computer system 800, may be configured to host different portions or instances of embodiments. For example, in one embodiment some elements may be implemented via one or more nodes of computer system 800 that are distinct from those nodes implementing other elements.

In various embodiments, computer system 800 may be a uniprocessor system including one processor 802, or a multiprocessor system including several processors 802 (e.g., two, four, eight, or another suitable number). Processors 802 may be any suitable processor capable of executing instructions. For example, in various embodiments processors 802 may be general-purpose or embedded processors implementing any of a variety of instruction set architectures (ISAs), such as the x86, PowerPC, SPARC, or MIPS ISAs, or any other suitable ISA. In multiprocessor systems, each of processors 802 may commonly, but not necessarily, implement the same ISA.

System memory 804 may be configured to store program instructions 820 accessible by processor 802. In various embodiments, system memory 804 may be implemented using any suitable memory technology, such as static random access memory (SRAM), synchronous dynamic RAM (SDRAM), nonvolatile/Flash-type memory, or any other type of memory. Additionally, existing camera control data 822 of memory 804 may include any of the information or data structures described above. In some embodiments, program instructions 820 and/or data 822 may be received, sent or stored upon different types of computer-accessible media or on similar media separate from system memory 804 or computer system 800. In various embodiments, some or all of the functionality described herein may be implemented via such a computer system 800.

In one embodiment, I/O interface 806 may be configured to coordinate I/O traffic between processor 802, system memory 804, and any peripheral devices in the device, including network interface 810 or other peripheral interfaces, such as input/output devices 812. In some embodiments, I/O interface 806 may perform any necessary protocol, timing or other data transformations to convert data signals from one component (e.g., system memory 804) into a format suitable for use by another component (e.g., processor 802). In some embodiments, I/O interface 806 may include support for devices attached through various types of peripheral buses, such as a variant of the Peripheral Component Interconnect (PCI) bus standard or the Universal Serial Bus (USB) standard, for example. In some embodiments, the function of I/O interface 806 may be split into two or more separate components, such as a north bridge and a south bridge, for example. Also, in some embodiments some or all of the functionality of I/O interface 806, such as an interface to system memory 804, may be incorporated directly into processor 802.

Network interface 810 may be configured to allow data to be exchanged between computer system 800 and other devices attached to a network 824 (e.g., carrier or agent devices) or between nodes of computer system 800. Network 824 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 810 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 812 may, in some embodiments, include one or more display terminals, keyboards, keypads, touchpads, scanning devices, voice or optical recognition devices, or any other devices suitable for entering or accessing data by one or more computer systems 800. Multiple input/output devices 812 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 810.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera, comprising:
   a lens group comprising one or more lens elements;
   an image sensor package comprising:
      an image sensor; and
      a substrate, wherein the image sensor is electrically connected to the substrate via one or more wire bond electrical interconnects;
   an actuator for causing a flex circuit to flex, wherein a first portion of the actuator moves together with a first portion of the flex circuit, the image sensor, and the substrate, and wherein a second portion of the actuator is fixedly attached to a stationary structure of the camera; and
   the first portion of the flex circuit fixedly coupled with the substrate, wherein the flex circuit is configured to:
      flex, upon activation of the actuator, to move the image sensor package relative to the lens group, and
      convey electrical signals between the substrate and one or more stationary components to which a second portion of the flex circuit is attached.

2. The camera of claim 1, wherein:
   the one or more lens elements define an optical axis; and
   the actuator is configured to move the image sensor package in at least one direction parallel to the optical axis and in directions orthogonal to the optical axis.

3. The camera of claim 1, wherein the first portion of the actuator is fixedly coupled with the substrate.

4. The camera of claim 1, wherein:
   the image sensor package further comprises:
      a carrier fixedly coupled with the substrate;
   the actuator comprises a voice coil motor (VCM) actuator;
   the first portion comprises one or more magnets attached to the carrier; and
   the second portion comprises one or more coils.

5. The camera of claim 1, wherein the substrate comprises:
   an upper portion, comprising:
      a first inner surface that extends in a first direction orthogonal to an image plane defined by the image sensor; and
   a lower portion, comprising:
      a second inner surface that extends in the first direction orthogonal to the image plane, wherein the second inner surface is closer to the image sensor, relative to the first inner surface; and
      a ledge surface that extends, in a second direction parallel to the image plane, from the first inner surface to the second inner surface.

6. The camera of claim 5, wherein the one or more wire bond electrical interconnects comprise:
   a first end portion that is bonded to the image sensor; and
   a second end portion that is bonded to the ledge surface.

7. The camera of claim 1, further comprising:
   a stiffener fixedly coupled with the image sensor and the flex circuit, such that at least a portion of the flex circuit is sandwiched between the stiffener and the substrate.

8. The camera of claim 7, wherein:
   the stiffener is attached to a bottom of the image sensor.

9. The camera of claim 1, wherein:
   the flex circuit comprises edges that define a cut-out that is positioned, in a direction orthogonal to an image plane of the image sensor, along a plane that intersects the image sensor.

10. The camera of claim 1, wherein the first portion of the flex circuit comprises an inner frame, and wherein the second portion of the flex circuit comprises an outer frame, and wherein the flex circuit comprises:
    a flexure arrangement, comprising:
       one or more flexure arms that are connected to the inner frame and to the outer frame, wherein:
          the one or more flexure arms allow motion of the image sensor package enabled by the actuator; and
          electrical traces on at least a portion of the one or more flexure arms are configured to convey electrical signals between the inner frame and the outer frame; and
    a stiffener fixedly coupled with the image sensor and the inner frame.

11. A device, comprising:
    one or more processors;
    memory storing program instructions executable by the one or more processors to control operations of a camera; and
    the camera, comprising:
       a lens group comprising one or more lens elements;
       an image sensor package that is movable relative to the lens group, the image sensor package comprising:
          an image sensor; and
          a substrate, wherein the image sensor is electrically connected to the substrate via one or more wire bond electrical interconnects;
          a stiffener fixedly attached to a bottom side of the image sensor, wherein the bottom side is opposite a top side of the image sensor; and
          an optical element directly attached to a top side of the substrate, wherein the top side of the image sensor faces an optical filter;

wherein the image sensor is entirely encapsulated within a chamber at least partially defined by the substrate, the stiffener, and the optical element; and an actuator for moving the image sensor package.

12. The device of claim 11, wherein:
the one or more lens elements define an optical axis; and
the actuator comprises a voice coil motor (VCM) actuator configured to move the image sensor package in at least one direction parallel to the optical axis.

13. The device of claim 12, wherein:
the image sensor package further comprises:
   a carrier fixedly coupled with the substrate; and
the VCM actuator comprises:
   one or more magnets attached to the carrier; and
   one or more coils attached to a stationary structure of the camera.

14. The device of claim 11, wherein the substrate comprises:
an upper portion, comprising:
   a first inner surface that extends in a first direction orthogonal to an image plane defined by the image sensor; and
a lower portion, comprising:
   a second inner surface that extends in the first direction orthogonal to the image plane, wherein the second inner surface is closer to the image sensor, relative to the first inner surface; and
   a ledge surface that extends, in a second direction parallel to the image plane, from the first inner surface to the second inner surface.

15. The device of claim 14, wherein the one or more wire bond electrical interconnects comprise:
a first end portion that is bonded to the image sensor; and
a second end portion that is bonded to the ledge surface.

16. The device of claim 11, wherein the optical element comprises an infrared cut-off filter (IRCF).

17. The device of claim 11, wherein the camera further comprises a flex circuit fixedly coupled with the substrate, wherein the flex circuit comprises edges that define a cut-out that is positioned, in a direction orthogonal to an image plane of the image sensor, along a plane that intersects the image sensor.

18. The device of claim 11, wherein:
the substrate is integrally formed with a flex circuit using an organic material to produce a substrate-flex circuit hybrid structure; and
the camera further comprises a stiffener attached to a bottom side of the image sensor and a bottom side of the substrate-flex circuit hybrid structure.

19. A method of assembling a camera, the method comprising:
attaching a carrier to a substrate;
attaching a first portion of a voice coil motor (VCM) actuator to the carrier;
attaching a second portion of the VCM actuator to a stationary structure of the camera, wherein the VCM actuator is for causing a flex circuit to move;
connecting a first portion of the flex circuit to the substrate, wherein the flex circuit is configured to:
   move, upon activation of the VCM actuator, an image sensor of the camera and the substrate together with the first portion of the VCM actuator and the first portion of the flex circuit relative to a lens group of the camera, and
   convey electrical signals between the substrate and one or more stationary components to which a second portion of the flex circuit is attached, and
connecting the image sensor to the substrate via one or more wire bond electrical interconnects, wherein:
   the connecting the image sensor to the substrate via the one or more wire bond electrical interconnects comprises:
      bonding a first end portion of the one or more wire bond electrical interconnects to the image sensor; and
      bonding a second end portion of the one or more wire bond electrical interconnects to the substrate.

* * * * *